United States Patent
Hennig et al.

(10) Patent No.: US 6,898,222 B2
(45) Date of Patent: May 24, 2005

(54) DIODE LASER ARRANGEMENT WITH A PLURALITY OF DIODE LASER ARRAYS

(75) Inventors: Petra Hennig, Stadtroda (DE); Guenter Hollemann, Jena (DE)

(73) Assignee: Jenoptik Laserdiode GmbH, Jena (DE)

( * ) Notice: Subject to any disclaimer, the term of this patent is extended or adjusted under 35 U.S.C. 154(b) by 156 days.

(21) Appl. No.: 10/203,221

(22) PCT Filed: Nov. 21, 2001

(86) PCT No.: PCT/DE01/04398

§ 371 (c)(1),
(2), (4) Date: Dec. 26, 2002

(87) PCT Pub. No.: WO02/47224

PCT Pub. Date: Jun. 13, 2002

(65) Prior Publication Data

US 2003/0099267 A1 May 29, 2003

(51) Int. Cl.$^7$ ................................................ H01J 3/045
(52) U.S. Cl. ............................ 372/36; 372/34; 372/68; 372/69
(58) Field of Search ............................ 372/36, 68, 69

(56) References Cited

U.S. PATENT DOCUMENTS

| | | | |
|---|---|---|---|
| 3,622,906 A | | 11/1971 | Nyul |
| 4,489,477 A | * | 12/1984 | Chik et al. .................... 438/17 |
| 4,881,237 A | | 11/1989 | Donnelly |
| 4,899,204 A | * | 2/1990 | Rosen et al. ................. 250/551 |
| 5,105,429 A | | 4/1992 | Mundinger et al. |
| 5,105,430 A | | 4/1992 | Mundinger et al. |
| 5,223,741 A | * | 6/1993 | Bechtel et al. ............... 257/678 |
| 5,371,753 A | * | 12/1994 | Adsett .......................... 372/36 |
| 5,471,055 A | * | 11/1995 | Costanzo et al. ......... 250/252.1 |
| 5,495,490 A | * | 2/1996 | Rice et al. .................... 372/34 |
| 5,668,822 A | | 9/1997 | Tada |
| 5,764,675 A | * | 6/1998 | Juhala .......................... 372/50 |
| 5,774,488 A | * | 6/1998 | Kmetec ......................... 707/5 |
| 5,978,404 A | | 11/1999 | Ishihara |
| 6,002,695 A | * | 12/1999 | Alfrey et al. ................. 372/22 |
| 6,044,096 A | | 3/2000 | Wolak et al. |
| 6,124,973 A | | 9/2000 | Du et al. |
| 6,240,116 B1 | * | 5/2001 | Lang et al. ................... 372/50 |
| 2002/0155631 A1 | * | 10/2002 | Saitoh et al. ................. 438/22 |

FOREIGN PATENT DOCUMENTS

| | | |
|---|---|---|
| DE | 43 15 580 | 11/1994 |
| DE | 43 35 512 | 6/1995 |
| DE | 195 36 463 | 4/1997 |
| DE | 197 50 879 | 6/1998 |
| DE | 195 37 265 C1 | 3/1999 |
| DE | 198 21 544 | 12/1999 |
| DE | 198 46 532 C1 | 5/2000 |
| EP | 0 590 232 | 4/1994 |
| GB | 2299205 A | 9/1998 |
| GB | 2329758 A | 3/1999 |

* cited by examiner

Primary Examiner—Don Wong
Assistant Examiner—Dung Nguyen
(74) Attorney, Agent, or Firm—Reed Smith LLP

(57) ABSTRACT

A diode laser arrangement is disclosed wherein a radiation source is designed which can be scaled with respect to power such that different types of cooling can be applied and the configuration of the radiation field is suitable for adapting to different tasks in a simple manner. For this purpose, every diode laser is connected to a thermal contact surface of a separate, heat-spreading carrier which is fastened to a cooling surface of a common cooling element so as to be electrically insulated. The carriers are arranged adjacently in such a way that the line-shaped emission regions of the diode lasers are adjacent in series and the p-n junction planes extend parallel to the thermal contact surfaces. The diode laser arrangement is particularly suitable as a pump light source.

25 Claims, 3 Drawing Sheets

DIODE LASER ARRANGEMENT WITH A PLURALITY OF DIODE LASER ARRAYS

CROSS-REFERENCE TO RELATED APPLICATIONS

This application claims priority of International Application No. PCT/DE01/04398, filed Nov. 21, 2001 and German Application No. 100 61 265.2, filed Dec. 6, 2000, the complete disclosures of which are hereby incorporated by reference.

BACKGROUND OF THE INVENTION

1. Field of the Invention

The invention is directed to a diode laser arrangement with a plurality of diode laser arrays, each of which is connected with a thermal contact surface of a heat-spreading carrier and contains a p-n junction plane parallel to the thermal contact surface. The carriers are fastened adjacent to one another in the array direction to a cooling surface of a common cooling element so as to be electrically insulated, so that the cooling surface extends parallel to the thermal contact surfaces.

2. Description of the Related Art

High-power laser diodes which are generally constructed as arrays and are stacked to form two-dimensionally emitting surfaces with increased radiating power are used for industrial laser machining of material, for pumping solid state lasers and in the field of medical engineering. Improved radiation characteristics can be achieved by collimating the so-called fast axis (perpendicular to the p-n junction plane) and also, additionally, by collimating the slow axis. Finally, beam shaping or beam symmetrization leads to a further improvement in beam density and beam quality. Typical dimensions are about 5 to 12 mm for the array width and 5 to 100 mm for the stack height. Up to 50 laser diode arrays can be arranged one on top of the other in a laser diode stack.

Stackable systems require efficient cooling due to their compact construction, especially since the distance between the arrays is to be kept as small as possible in order to achieve higher power densities. In the past, this led to the development of water-cooled heatsinks containing microchannels in order to achieve a lower thermal resistance with extremely compact dimensions.

Microchannel heatsinks of the type mentioned above are known, for example, from DE 43 15 580 and DE 197 50 879. U.S. Pat. No. 5,105,429 and U.S. Pat. No. 5,105,430 use these heatsinks expressly for the purpose of generating stackable systems in which the coolant is guided through the stack in continuous paths. Each of the microchannel heatsinks in the stack comprises a multilayer structure with microchannels in the upper layer and has inlets and outlets connected to the continuous paths.

U.S. Pat. No. 5,105,429 and U.S. Pat. No. 5,105,430 are also referenced in DE 43 35 512. The latter uses a so-called heatspreader to substantially increase the small heat-conducting surface of the laser diode and, therefore, to achieve a multiple increase in cooling efficiency.

It is also known to connect a laser bar with a substrate which is divided into partial regions and which rests on a heatsink. In EP 0 590 232 A1, in order to prevent thermal crosstalk between the individual laser diodes of the laser bar, areas with poor heat conductivity are arranged below a region between the individual diodes; in DE 198 21 544 A1, the laser diodes of the laser bar communicate with an individual web of dielectric material.

DE 195 36 463 A1 describes a laser diode component with a semiconductor body which is fastened to a heatsink. The heatsink comprises a cooling body with an electrically and thermally conducting connection plate to which the semiconductor body is fastened. A large number of these laser diode components can be fabricated as a unit and subsequently divided up.

In the modular construction according to DE 43 15 580 which is suited in principle for stacking, the functions of a microchannel heatsink are divided between five layers. In a microchannel plate or distributor plate, the coolant supplied via an inlet is distributed to the microchannels located below a diode laser fastened to the cover layer. The coolant is conducted, via connection channels in an intermediate layer, into a collecting plate which connects to an exit. A bottom plate closes the microchannel heatsink at the bottom.

Although the direct (active) liquid cooling is extremely effective, the microchannel heatsinks also have drawbacks. For instance, the structures of the microchannels are complicated to produce. The coolant, frequently water, places very high demands on the liquid-conducting materials, seals and coolant quality due to the close proximity to the sensitive semiconductor components.

Problems also arise because the liquid-guiding channels must traverse areas with different electric potentials. If elaborate steps are not taken, very high electrical fields sometimes occur which can trigger highly complex electrochemical processes.

Enclosing the stacks for protection against external environmental influences necessitates particularly great efforts for eliminating or preventing the formation of condensation in the housing due to residual leak rate.

There are also disadvantages connected with the stacking itself. As the distance between the arrays is reduced, not only is an increasingly effective cooling required, but the reduction itself is additionally bound by geometric limits.

An arrangement suggested in DE 43 15 580, in which a plurality of laser diode bars are mounted on a large-area microchannel heatsink, is also not capable of closing the geometry-dependent free space between the radiating surfaces of edge emitters.

Finally, the diode stacks have the added disadvantage that they are limited only to determined applications because of the predetermined configuration of their radiation field.

OBJECT AND SUMMARY OF THE INVENTION

Therefore, it is the primary object of the invention to design a radiation source which can be scaled with respect to power such that different types of cooling can be applied and the configuration of the radiation field is suitable for adapting to different tasks in a simple manner.

The object is met by a diode laser arrangement of the type mentioned in the beginning in that the diode laser arrays are fastened to the thermal contact surfaces of the carriers so as to be separated from one another and are electrically connected in series, wherein every carrier is constructed as an electric contact to the connected diode laser line and has another contact which is connected to the carrier so as to be electrically insulated.

In the series connection, there is an electric connection from the contact, which is connected with the carrier so as to be electrically insulated, to an adjacent carrier in the series connection.

A collimator for the fast axis of an emitted laser beam bundle perpendicular to the p-n junction plane is advantageously associated with every diode laser array.

In a particularly advantageous construction, the cooling surface has a step structure and the carriers rest on the steps of the step structure. In an arrangement of this kind, laser radiation is emitted by emission regions which lie next to one another in the array direction of the diode laser arrays and which are arranged so as to be offset by the height of the steps. By means of special optics, it is possible to modify this laser radiation in such a way that a beam quality comparable to that of the stack is achieved. The optics are arranged after the diode laser arrays as a deflecting element which arranges the laser beam bundles adjacent to one another along their elongated extension. The deflecting element comprises a stack of individual elements, each of which is associated with a diode laser line. While one of the side surfaces of the individual element which extend parallel to one another in pairs serves as a beam entry surface, a first end face is constructed as a reflection element which deflects the laser beam bundle in direction of a second end face provided for the beam exit. The extension of the beam entry surface in direction perpendicular to the p-n junction plane exceeds the extension of the collimated laser beam bundle in this direction in such a way that low-attenuation in-coupling of radiation is ensured and reflections are prevented at the side surfaces of the individual element in direction of the fast axis. This ensures that no substantial beam expansion occurs in the individual elements of different length. Due to a divergence of the laser beam bundles in direction of the slow axis, total internal reflection takes place at the respective side surfaces of the individual element, which results in advantageous beam homogenization.

It is advantageous when the beam entry surface and the end face for the beam exit have an antireflection coating.

The configuration according to the invention allows the common cooling element to be coupled to a wide variety of heat-dissipating devices such as Peltier elements, a water cooling arrangement or forced convection arrangement. In every case, there should be a heat transmission coefficient of at least 0.03 W/mm$^2$K between the carrier and the cooling surface. Also, the problem of condensation which occurs in the prior art is solved in a simple manner because liquid-guiding channels and seals can be placed outside of a housing provided for the diode laser arrays. Additionally, of course, drying means can be contained or safety arrangements can be integrated in the housing that is provided with an exit area for the laser beam bundles.

Finally, it can also be advantageous when a collimator for the slow axis parallel to the p-n junction plane is associated with every diode laser line.

The diode laser arrangement according to the invention can also contain diode laser arrays emitting laser beam bundles which differ from one another with respect to polarization state or wavelength. Optical elements can also be arranged following the diode laser arrays in the beam path for changing the polarization of the laser beam bundles. In such cases, an element can be arranged in the beam paths of the diode laser arrays for uniting the laser beam bundles that differ from one another.

When the diode laser arrays are arranged with their carriers on a common planar cooling element, this element for beam unification should comprise plate-shaped partial elements, each of which is associated with a diode laser array. Every partial element contains beam-deflecting end faces which also serve as beam exits and sides surfaces which extend parallel to one another, the side surfaces facing the diode laser arrays serving as beam entry surfaces. The beam-deflecting end faces which are constructed so as to be reflecting for the laser beam bundles of the associated diode laser and which enclose, with the beam entry surfaces, an angle at which a beam orientation to the end faces serving as beam exit is ensured are connected to an end face of an adjacent partial element for coupling the laser beam bundles which differ from one another, which end face serves as the beam exit.

The connected end faces are transparent for the laser beam bundle which is coupled by one partial element into the other partial element.

When every diode laser line rests with its carrier on a step of a step-shaped cooling surface of a common cooling element, the element for beam unification comprises a stack of individual elements which are each associated with a diode laser line, one of which individual elements which is located at the edge of the stack is provided as beam exit element and every other individual element is provided for coupling a guided laser beam bundle into the neighboring individual element in the stack. One of the side faces of each individual element which extend parallel to one another in pairs serves as a beam entry surface and a first end face is constructed as a reflection element which deflects the laser beam bundle in the direction of a second end face. Due to the fact that the second end faces which are directed parallel to one another are inclined relative to the side faces connected to one another in the stack, the laser beam bundles which differ from one another are guided by selective reflection and transmission via the second end faces. The second end face of the individual element located at the edge of the stack serves as a beam-uniting surface for all laser beam bundles.

The invention will be described more fully in the following with reference to the schematic drawings.

DESCRIPTION OF THE PREFERRED EMBODIMENTS

Figure 1:
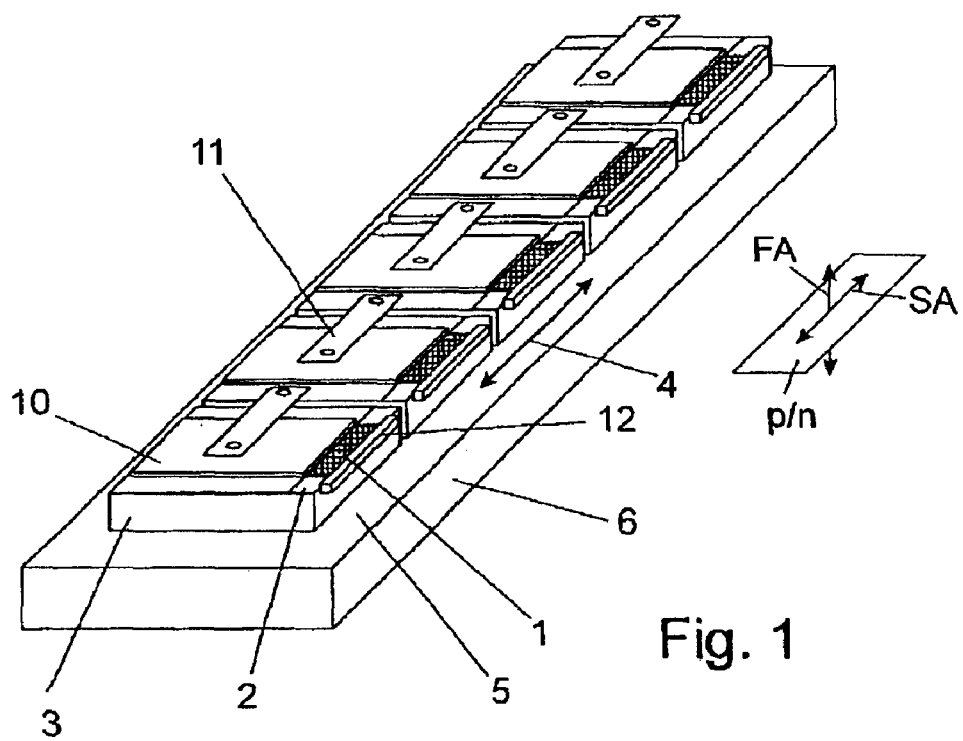
FIG. 1 shows a perspective view of an arrangement of diode lasers on a common, planar cooling element.
Figure 2:
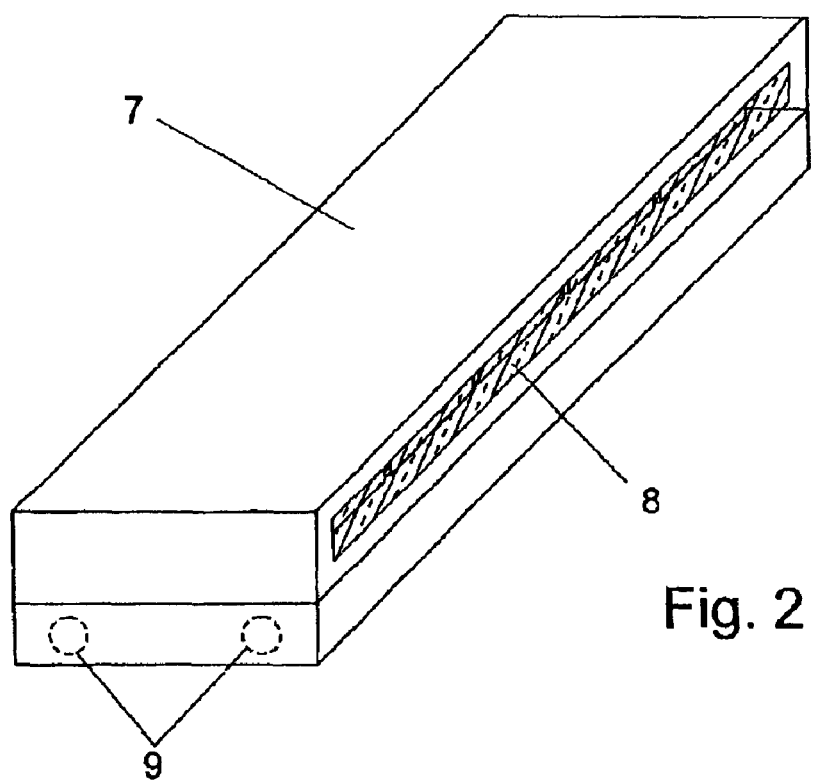
FIG. 2 shows a perspective view of a diode laser arrangement enclosed by a housing.

In the arrangement shown in FIG. 1, diode lasers 1 are provided in the form of diode laser arrays or diode laser bars, each of which is connected to a thermal contact surface 2 of a separate, heat-spreading carrier 3 of copper for dissipating heat. For the sake of clarity, the Figures always show only one of the elements of identical construction. The diode lasers 1 have emission regions which are elongated in one direction, designated by an arrow 4, parallel to the thermal contact surfaces 2. For this reason, the carriers 3 are arranged adjacent to one another and fastened to a cooling surface 5 of a common cooling element 6 so as to be electrically insulated, but with low heat transmission resistance, such that the cooling surface 5 extends parallel to the thermal contact surfaces 2 and the diode lasers 1 lie in a row in their direction of extension and accordingly form a radiation source with a line-shaped laser beam bundle profile. Further, the diode lasers 1 are arranged with their p-n junction planes p/n parallel to the thermal contact surfaces 2, so that the laser-diode-specific fast axis FA extends perpendicular to the thermal contact surface 2 and the slow axis SA extends parallel to this surface (detail, FIG. 1). The cooling element 6 comprises materials with good heat conductivity, e.g., copper, and is usually cooled by Peltier elements, not shown, but can also be water-cooled. For protection against external influences, the diode lasers 1 are enclosed by a housing in that a top 7 having an exit window 8 for the laser beam bundle is placed on the cooling element 6 (FIG. 2). Alternatively, the laser beam bundle can also be coupled into a light guide which forms the closure of the housing. It is also possible to use fiber connectors, focusing optics or other optics for beam continuation. Electric safety devices, e.g., relays or shunts for preventing ESD damage, monitor diodes and temperature sensors for the laser diodes and storage media for diode laser data, can be additionally integrated in the diode laser module constructed in this way.

Further, the diode laser module is preadjusted with respect to radiation and is provided with reference points, not shown, which can be arranged so as to be reproducible with respect to a reference location for ensuring a fast and simple exchangeability. The simplest solution would be pins, for example, which engage in a catch at a predetermined location.

Insofar as connections are required for water cooling, they can easily be arranged on the outside of the housing, as is illustrated by way of example by the channels, indicated by dashes and designated by 9, at the end side of the cooling element 6. Based on the suggested solution, it is not necessary to provide sealing against liquid inside the housing. Nevertheless, it may be advantageous when drying means are accommodated in the housing.

The diode lasers 1 are preferably operated in an electrical series connection, since the demands on the power supply equipment and electric lines are not as high as would be the case in a parallel circuit. For this purpose, the carriers 3, besides their heat-spreading function, form an electric contact and serve as anode for the diode lasers 1. Cathode elements 10 which are arranged on top of the carriers 3 so as to be electrically insulated are connected to the respective adjacent carrier 3 by current bridges 11 for the series connection.

Every diode laser 1 is followed by optics 12 in the form of a cylindrical lens for collimating the fast axis. In addition, the divergence of the slow axis can also be reduced by means of a collimating array and optical elements can also be contained for changing the polarization of the radiation, e.g., half-wave phase retardation plates.

Figure 3:
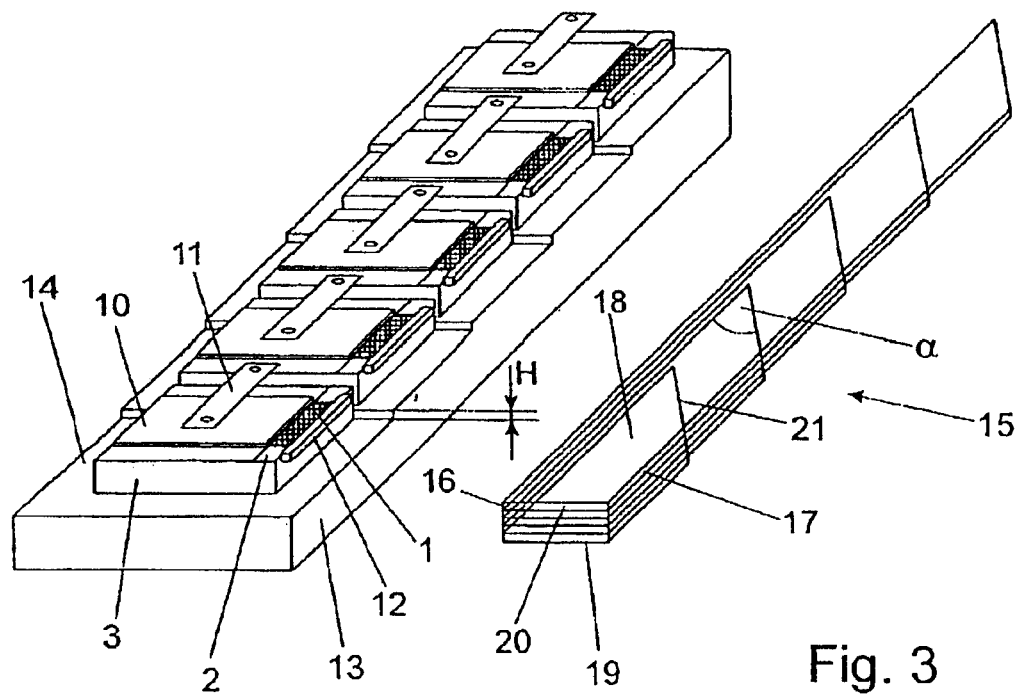
FIG. 3 shows a perspective view of an arrangement of diode lasers on a common, step-shaped cooling element with an optical deflecting device.

In contrast to the construction according to FIG. 1, the heatsink shown in FIG. 3 contains a cooling element 13 in which the cooling surface has a step structure, and the carriers 3 with the diode lasers 1 located on them lie on its steps 14 so as to be electrically insulated, but with small thermal transmission coefficients. As a result, the diode lasers 1 which lie adjacent to one another in the direction along which the emission regions extend are offset, respectively, by a height H of the steps 14, so that the laser beam bundles which are emitted by the emission regions and collimated in the fast axis can be rearranged by means of a deflecting element 15. This results in a beam bundle which is composed of individual "beam packages" and which corresponds to that of a diode stack and in which the individual laser beam bundles are arranged adjacent to one another in their elongated extension.

The deflecting element 15 comprises a stack of preferably plate-shaped individual elements whose quantity corresponds to that of the diode lasers 1 and which are each arranged in the beam path of a diode laser 1 at the height of the respective step 14. Of the side surfaces 16, 17, 18, 19 which extend parallel to one another in pairs, the side surface 16 which is coated so as to be nonreflecting for the wavelength of the diode laser 1 serves as beam entry surface, and a first end face 20 which is likewise coated so as to be nonreflecting for the wavelength of the diode laser 1 serves as beam exit. A second end face 21 reflecting the wavelength of the diode laser 1 encloses an angle α with the beam entry surface such that the laser beam bundle is deflected in direction of the end face 20 for the beam exit. In the present example, the incident angle is 45°. The reflection at the end face 21 can be achieved by a highly reflective coating or the laser beam bundle impinges at an angle such that the conditions of total reflection are met (e.g., 41.8°, where n=1.5). In a direction perpendicular to the p-n junction plane, the extension of the side surface 16 serving as beam entry surface exceeds the extension of the laser beam bundle collimated in this direction in such a way that a low-attenuation in-coupling of radiation is ensured and reflections at the side surfaces 18, 19 of the individual element are prevented in direction of the fast axis.

Figure 4:
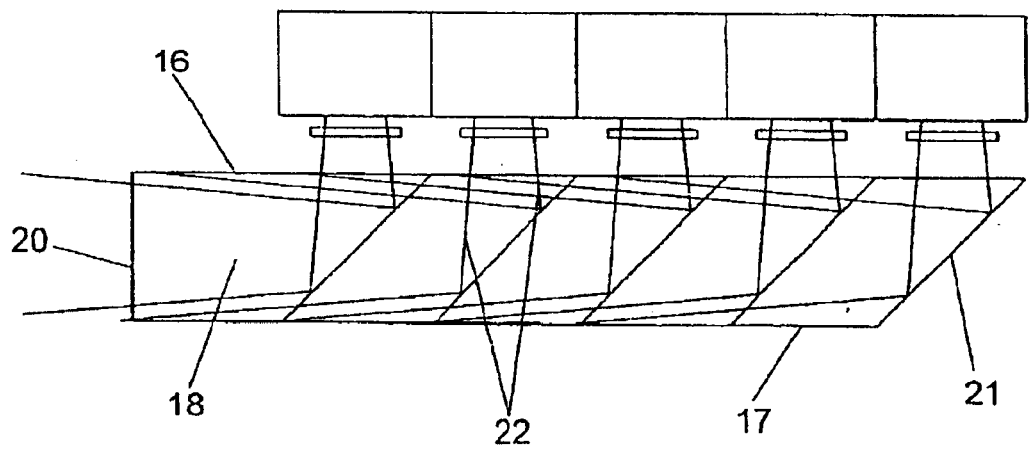
FIG. 4 is a top view of an arrangement according to FIG. 3 showing the beam path of the laser beam bundle in the slow axis.

However, a different approach is adopted with respect to the laser beam bundle in direction of the slow axis This will be illustrated with reference to FIG. 4. According to the construction shown in FIG. 3, the slightly divergent laser beam bundles 22 in direction of the slow axis are guided after being reflected at the respective deflecting end faces 21 through total internal reflection by the side surfaces 16, 17, while the beam quality remains unchanged. The beam mixing in the slow axis occurring in this connection advantageously leads to a homogenization of the power distribution along this axis.

Since the distance between the beam packages which are arranged one above the other is determined by the height H of the steps 14 and by the extension of the side surfaces 16 in direction perpendicular to the p-n junction plane, power density can be adjusted in a simple manner without substantially adapting the cooling system or design of the diode laser 1. This results in an extremely adaptable system whose basic elements are always produced and arranged in the same way.

Of course, it is possible to arrange additional optical elements in the beam path in front of and behind the deflecting element 15. These elements can be, for example, beam shapers which are arranged in front and which serve to symmetrize the beam quality in both axes, or focusing optics which are arranged behind in order to generate a pump spot or to couple the laser beam bundle into a fiber. The arrangement can also be installed in a housing as was described with reference to FIG. 2.

Figure 5:
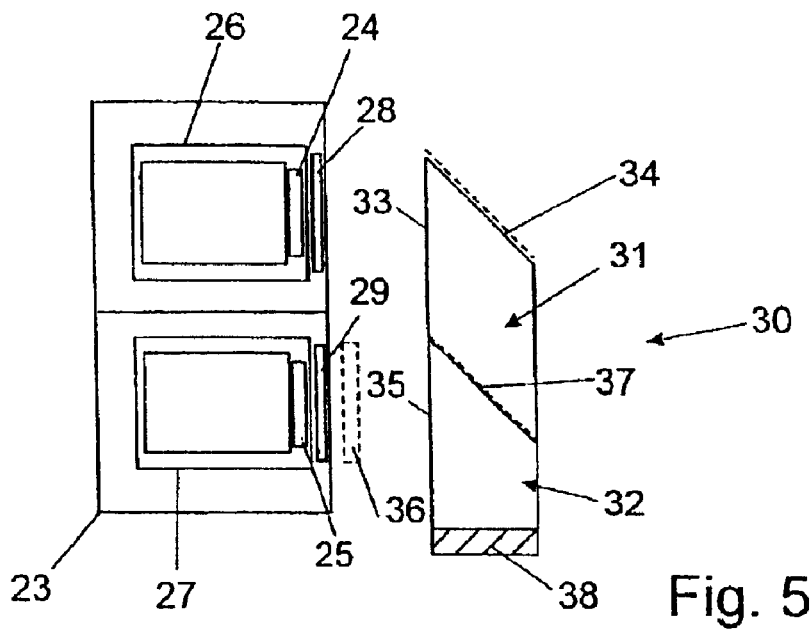
FIG. 5 is a top view of an arrangement of diode lasers on a step-shaped cooling element with an optical deflecting and coupling device for laser beam bundles which differ from one another with respect to polarization state or wavelength.
Figure 6:
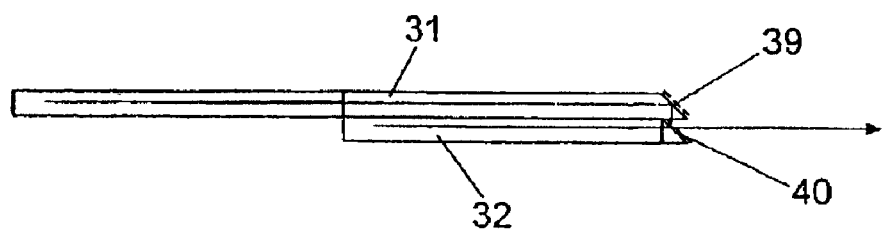
FIG. 6 is a side view showing the deflecting and coupling device from FIG. 5.

In the embodiment example according to FIGS. 5 and 6, referring to FIG. 3, two diode lasers 24, 25 on a step-shaped cooling element 23 have separate heat-spreading carriers 26, 27 and collimating optics 28, 29 associated with the latter for the fast axis. The generated collimated laser beam bundles are directed to a deflecting and coupling element 30 which in turn comprises individual elements 31, 32 in which beam guiding takes place in the slow axis in a manner similar to a waveguide. In a modification of the construction according to FIG. 3, the laser beam bundles of the two diode lasers 24, 25 may differ either in their polarization state or in the wavelength. Beam combining takes place by means of selectively acting reflective and antireflective surfaces of the individual elements 31, 32.

Accordingly, the laser beam bundle of the diode laser 24 which is TE-polarized, for example, is directed to a mirror surface 34 of the individual element 31, which mirror surface 34 is highly reflective for this polarization and is inclined by 45° to a beam entry surface 33. The other laser beam bundle which enters the individual element 32 via a beam entry surface 35 is TM-polarized and is directed, as an s-polarized beam bundle, to a surface 37 which is actively reflective for this polarization and which is directed parallel to the mirror surface 34. Both laser beam bundles pass through the respective individual element 31, 32 so as to be guided in the manner described with reference to FIGS. 3 and 4 and are united on the exit side by a coupling element 38. In addition, one of the individual elements, in this case, individual element 31, has a front reflection surface 39 which is inclined by 45° to the beam path and which deflects the laser beam bundle guided in the individual element and directs it to an element surface 40 at the front output of the other individual element, in this case, individual element 32, which element surface 40 extends parallel to the reflection surface 39. The element surface 40 is constructed so as to be highly reflective for the polarization state of the laser beam bundle deflected by the reflection surface 39 (s-polarization) and antireflective for the polarization state of the laser beam bundle guided in the other individual element 32 (p-polarization). When the laser beam bundles are identically polarized, the polarization direction of a diode laser must be rotated by means of a half-wave plate 36 indicated by dashed lines.

An arrangement which can be constructed in an analogous manner works in a wavelength-selective manner, i.e., laser beam bundles of diode lasers having different wavelengths are combined. For wavelength coupling, more than two laser beam bundles can be superimposed. Further processing can be carried out similar to a conventional laser array, e.g., by rearranging, focusing or the like. The laser beam is advisably collimated in both axes in order to prevent coupling losses due to divergent incidence.

Figure 7:
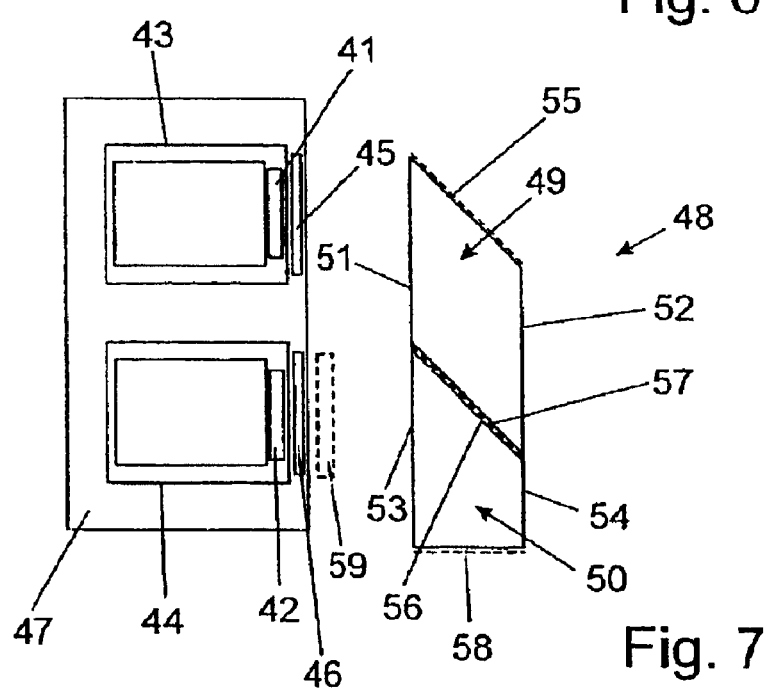
FIG. 7 is a top view of another arrangement of diode lasers on a planar cooling element with an optical deflecting and coupling device for laser beam bundles which differ from one another with respect to their polarization state or wavelength.

In another embodiment example according to FIG. 7, two diode lasers 41, 42 with separate heat-spreading carriers 43, 44 and associated collimating optics 45, 46 for the fast axis are arranged on a planar cooling element 47. A plate-shaped optical deflecting and coupling element 48 arranged in the beam paths of the diode lasers 41, 42 comprises plate-shaped partial elements 49, 50, wherein the quantity of partial plates is generally determined by the quantity of diode lasers which can be coupled. Both partial plates 49, 50 contain side surfaces which extend parallel to one another in pairs, only one pair of each, 51, 52 and 53, 54, respectively, being shown in the drawing. The side surfaces 51, 53 facing the diode lasers serve as beam entry surfaces. A first end face 55, 56 of the partial elements 49, 50 encloses an angle of 45° with the beam entry surface and acts in a reflecting manner with respect to the laser radiation of the associated diode laser 41 or 42. The partial elements 49, 50 are connected in that partial element 49 adjoins the first end face 56 of the partial element 50 by a second end face 57 extending parallel to end face 56. The end faces 56, 57 which are connected with one another form a coupling element for combining laser beam bundles which differ with respect either to polarization states or wavelength. For polarization coupling, the reflective characteristic in end face 56 for the polarization state of one laser beam bundle of the diode laser 42 must be supplemented by the characteristic of transparency for the polarization state of the other laser beam bundle of the diode laser 41 which has already passed through the partial element 49. A coating in which both characteristics are combined is preferably used for this purpose. Different polarization states are either provided by the diode lasers 41, 42 themselves (TE-polarization or TM-polarization) or a half-wave plate 59 is arranged in the beam path of one of the diode lasers. This possibility is illustrated by dashed lines.

Finally, a second end face 58 of the partial element 50 is provided for the beam exit. This second end face 58 is cut perpendicular to the beam propagation and is nonreflective for the two polarization states and all wavelengths.

While the foregoing description and drawings represent the present invention, it will be obvious to those skilled in the art that various changes may be made therein without departing from the true spirit and scope of the present invention.

What is claimed is:

1. A diode laser arrangement comprising:
 a plurality of diode laser arrays, each diode laser array being connected with a thermal contact surface of a heat-spreading carrier and containing a p-n junction plane parallel to the thermal contact surface;
 said heat spreading carriers arranged adjacent to one another, said diode laser arrays forming a radiation source with a line shaped laser beam bundle profile and fastened to a cooling surface of a common cooling element wherein each heat spreading carrier is electrically insulated from the cooling element;
 the cooling surface extending parallel to the thermal contact surfaces;
 said diode laser arrays being fastened to the thermal contact surfaces of said heat spreading carriers so as to be separated from one another and said diode laser arrays being electrically connected in series;
 every heat spreading carrier being constructed as an electric anode contact to the connected diode laser array and having a cathode contact which is connected to the heat spreading carrier and which is electrically insulated from the heat spreading carrier; and
 wherein each of the cathode contacts being electrically connected to an adjacent heat spreading carrier in a series connection.

2. The diode laser arrangement according to claim 1, wherein there is an electric connection from the contact which is connected with the heat spreading carrier so as to be electrically insulated to an adjacent heat spreading carrier in the series connection.

3. The diode laser arrangement according to claim 2, wherein a collimator for the fast axis of an emitted laser beam bundle perpendicular to the p-n junction plane is associated with every diode laser array.

4. The diode laser arrangement according to claim 3, wherein the cooling surface has a step structure and the heat spreading carriers rest on the steps of the step structure.

5. The diode laser arrangement according to claim 4, wherein a deflecting element is arranged after the diode laser arrays and arranges the laser beam bundles adjacently along their elongated extension.

6. The diode laser arrangement according to claim 5, wherein the deflecting element comprises a stack of individual elements, each of which is associated with a diode laser array, wherein one of the side surfaces of the individual element which extend parallel to one another in pairs serves as a beam entry surface, a first end face is constructed as a reflection element which deflects the laser beam bundle in direction of a second end face provided for the beam exit.

7. The diode laser arrangement according to claim 6, wherein the extension of the beam entry surface in direction perpendicular to the p-n junction plane exceeds the extension of the laser beam bundle in this direction in such a way that low-attenuation in-coupling of radiation is ensured and reflections are prevented at the side surfaces of the individual element in direction of the fast axis.

8. The diode laser arrangement according to claim 7, wherein the laser beam bundles have a divergence in direction of the slow axis such that total internal reflection takes place at the side surfaces of the individual element, which results in beam homogenization.

9. The diode laser arrangement according to claim 8, wherein the beam entry surface and the end face for the beam exit have an anti-reflection coating.

10. The diode laser arrangement according to claim 1, wherein the common cooling element is coupled to heat-dissipating devices.

11. The diode laser arrangement according to claim 10, wherein the heat-dissipating devices are Peltier elements.

12. The diode laser arrangement according to claim 10, wherein the heat-dissipating devices are constructed as a water cooling arrangement.

13. The diode laser arrangement according to claim 10, wherein the heat-dissipating devices make use of forced convection.

14. The diode laser arrangement according to claim 13, wherein there is a heat transmission coefficient of at least 0.03 W/mm$^2$K between the heat spreading carrier and the cooling surface.

15. The diode laser arrangement according to claim 3, wherein a collimator for the slow axis (SA) of an emitted laser beam bundle, which slow axis (SA) extends parallel to the p-n junction plane (p/n), is associated with every diode laser array.

16. The diode laser arrangement according to claim 3, wherein the diode laser arrays emit laser beam bundles which differ from one another with respect to polarization state.

17. The diode laser arrangement according to claim 3, wherein optical elements are arranged following the diode laser arrays in the beam path for changing the polarization of the laser beam bundles.

18. The diode laser arrangement according to claim 3, wherein the diode laser arrays emit laser beam bundles which differ from one another with respect to wavelength.

19. The diode laser arrangement according to claim 16, wherein a deflecting and coupling element of the laser beam bundles which differ from one another is arranged in the beam paths of the diode laser arrays.

20. The diode laser arrangement according to claim 19, wherein the deflecting and coupling element comprises plate-shaped partial elements, each of which is associated with a diode laser array and contains beam-deflecting end faces and an end face serving as beam exit and sides surfaces which extend parallel to one another, the side surfaces facing the diode laser arrays serving as beam entry surfaces, and in that the beam-deflecting end faces which are constructed so as to be reflecting for the laser beam bundles of the associated diode laser and, with the beam entry surfaces, enclose an angle at which a beam orientation to the end faces serving as beam exit is ensured are connected to an end face of an adjacent partial element for coupling the laser beam bundles which differ from one another, which end face serves as the beam exit, wherein the connected end faces are transparent for the laser beam bundle which is coupled by one partial element into the other partial element.

21. The diode laser arrangement according to claim 19, wherein every diode laser array rests with its heat spreading carrier on a step of a step-shaped cooling surface of a common cooling element.

22. The diode laser arrangement according to claim 21, wherein the deflecting and coupling element comprises a stack of individual elements which are each associated with a diode laser array, one of which individual elements which is located at the edge of the stack is provided as beam exit element and every other individual element is provided for coupling a guided laser beam bundle into the neighboring individual element in the stack, in that one side face of the side faces of each individual element which extend parallel to one another in pairs serves as a beam entry surface and a first end face is constructed as a reflection element which deflects the laser beam bundle in the direction of a second end face, and in that, because the second end faces which are directed parallel to one another are inclined relative to the side faces connected to one another in the stack, the laser beam bundles which differ from one another are guided by selective reflection and transmission via the second end faces and the second end face of the individual element located at the edge of the stack serves as a beam-uniting surface for all laser beam bundles.

23. The diode laser arrangement according to claim 1, wherein the diode laser arrays are enclosed by a common housing which contains an exit area for the laser beam bundles.

24. The diode laser arrangement according to claim 23, wherein drying means are contained in the housing.

25. The diode laser arrangement according to claim 23, wherein safety devices are integrated in the housing.

* * * * *